United States Patent [19]
Takahashi et al.

[11] Patent Number: 5,602,544
[45] Date of Patent: Feb. 11, 1997

[54] ABSOLUTE ENCODER AND METHOD OF GENERATING ITS CURRENT POSITION

[75] Inventors: Akira Takahashi; Seisuke Tsutsumi, both of Aichi, Japan

[73] Assignees: Mitsubishi Denki Kabushiki Kaisha; Mitsubishi Electric Engineering Co., Ltd., both of Tokyo, Japan

[21] Appl. No.: 389,660

[22] Filed: Feb. 16, 1995

[30] Foreign Application Priority Data

Feb. 18, 1994 [JP] Japan ..................... 6-021187

[51] Int. Cl.$^6$ .............................................. H03M 1/22
[52] U.S. Cl. ..................... 341/6; 341/6; 341/11; 250/231.1; 318/652
[58] Field of Search ..................... 341/6, 11, 13, 341/14; 250/231.1–231.18; 318/600–605, 652–661

[56] References Cited

U.S. PATENT DOCUMENTS 5,336,884  8/1994  Khoshnevisan et al. .......... 250/231.18
5,525,885  6/1995  Sato ........................... 318/632

FOREIGN PATENT DOCUMENTS

WO8606895  11/1986  WIPO ............................. H03M 1/22

*Primary Examiner*—Howard L. Williams
*Attorney, Agent, or Firm*—Sughrue, Mion, Zinn, Macpeak & Seas

[57] ABSTRACT

An absolute encoder which is operative to provide a plurality of signals indicating a current position, that signal including a least significant bit whose edge is detected and used as a basis for adjusting the current value under a variety of circumstances, typically based on the speed of the encoder. If the encoder is operating at high speed, a predetermined value may be assigned to the current position, while if operating at low speed, the value may be edge settable at least once at speeds below a limit value.

20 Claims, 17 Drawing Sheets

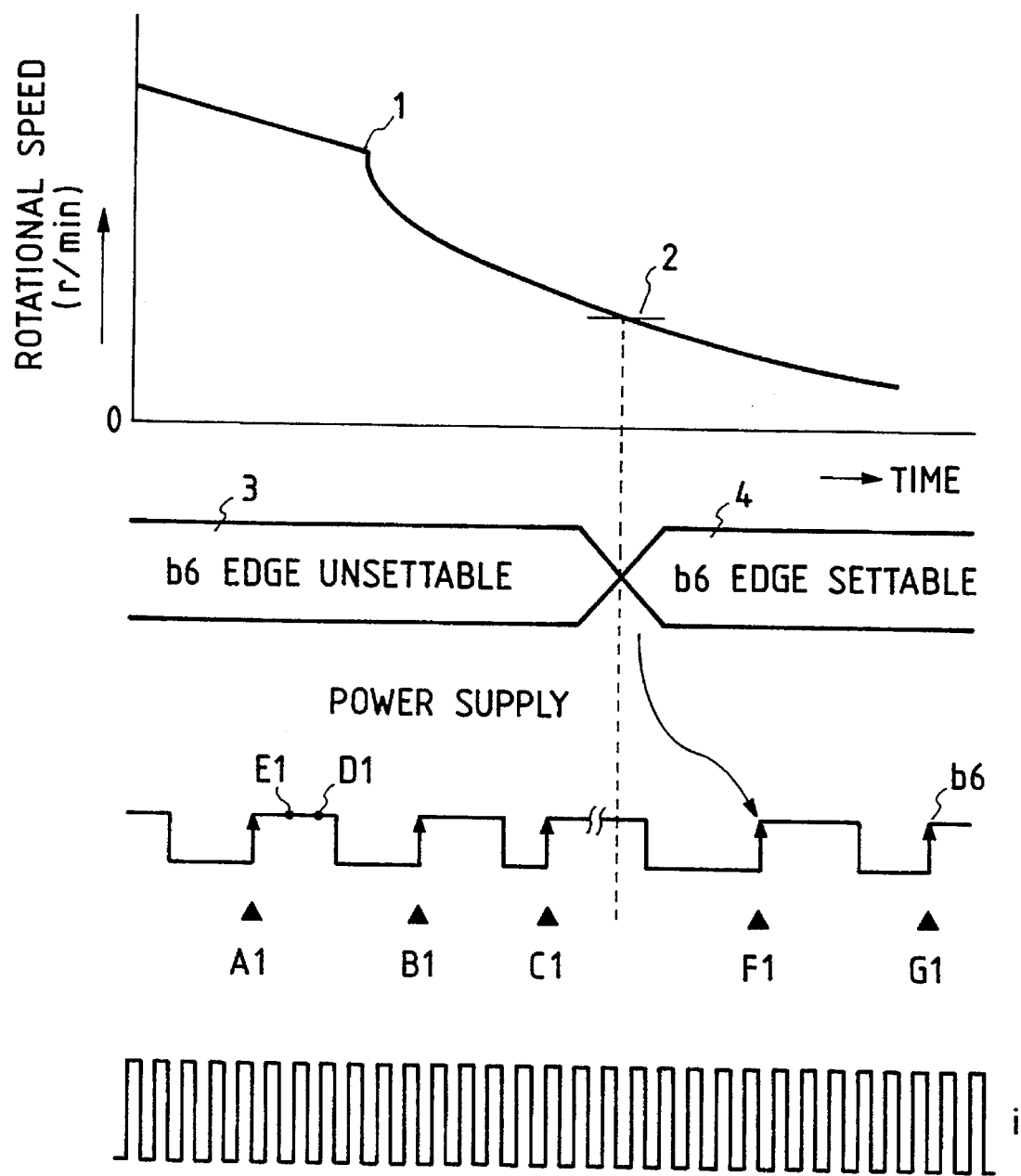

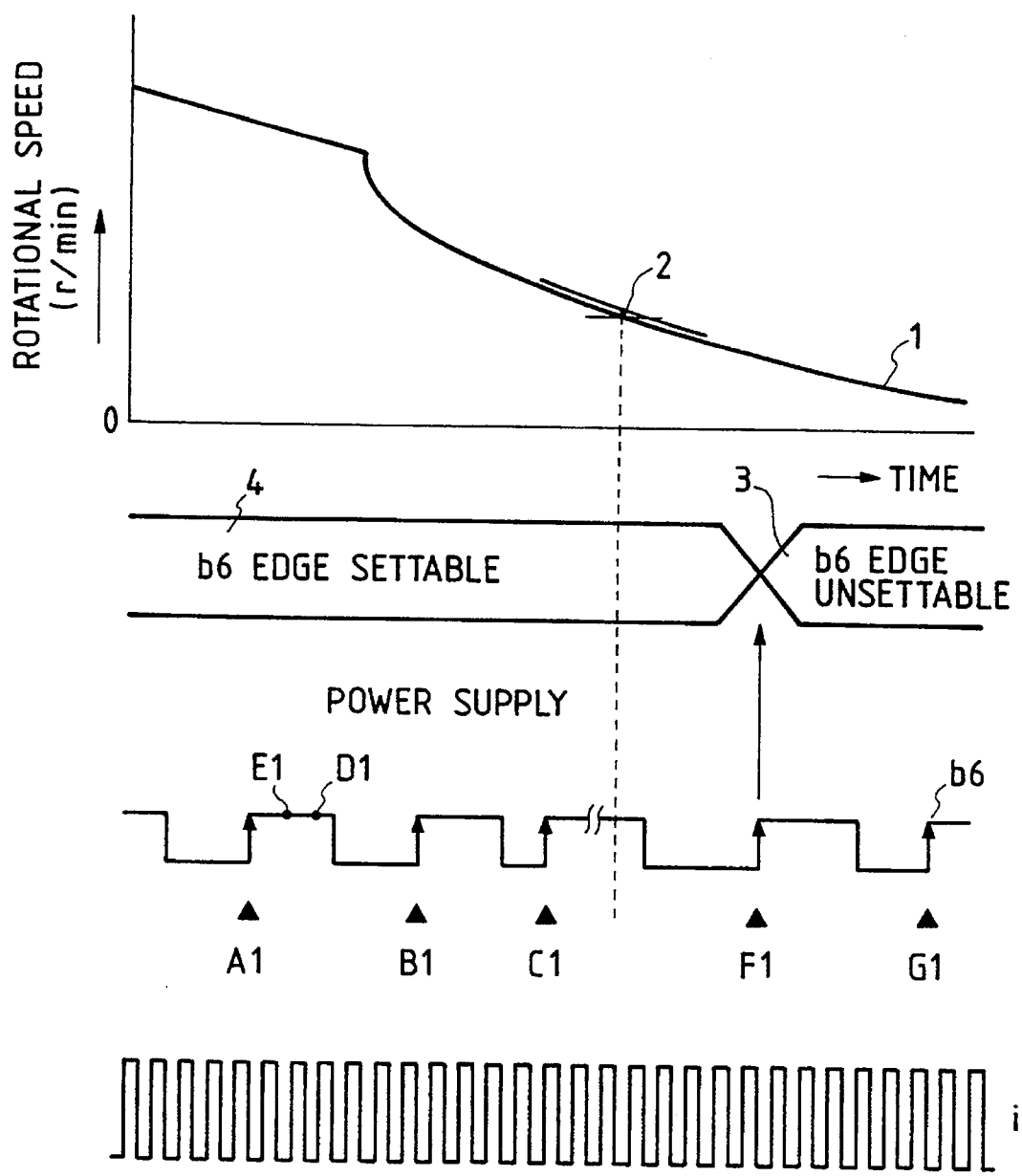

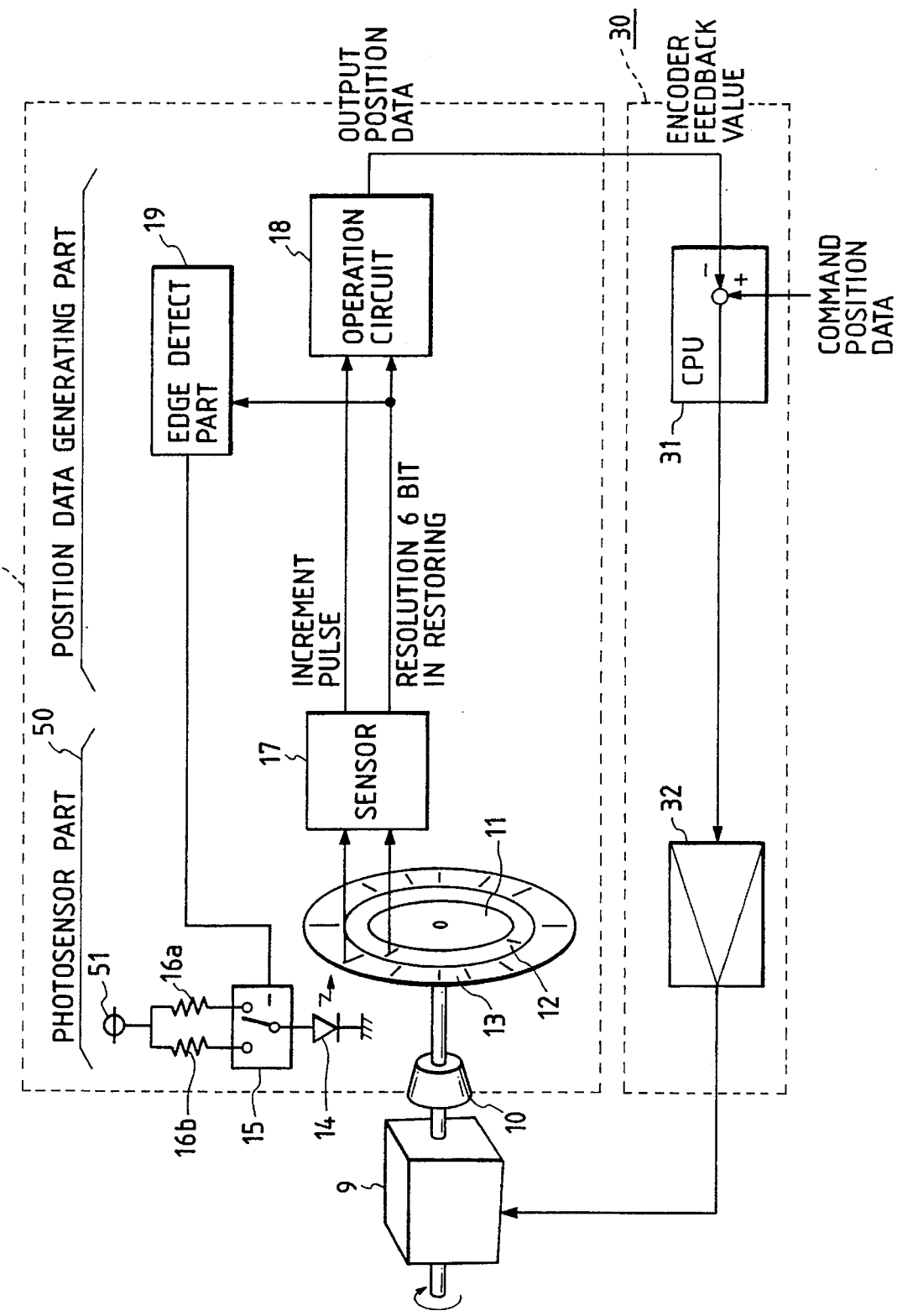

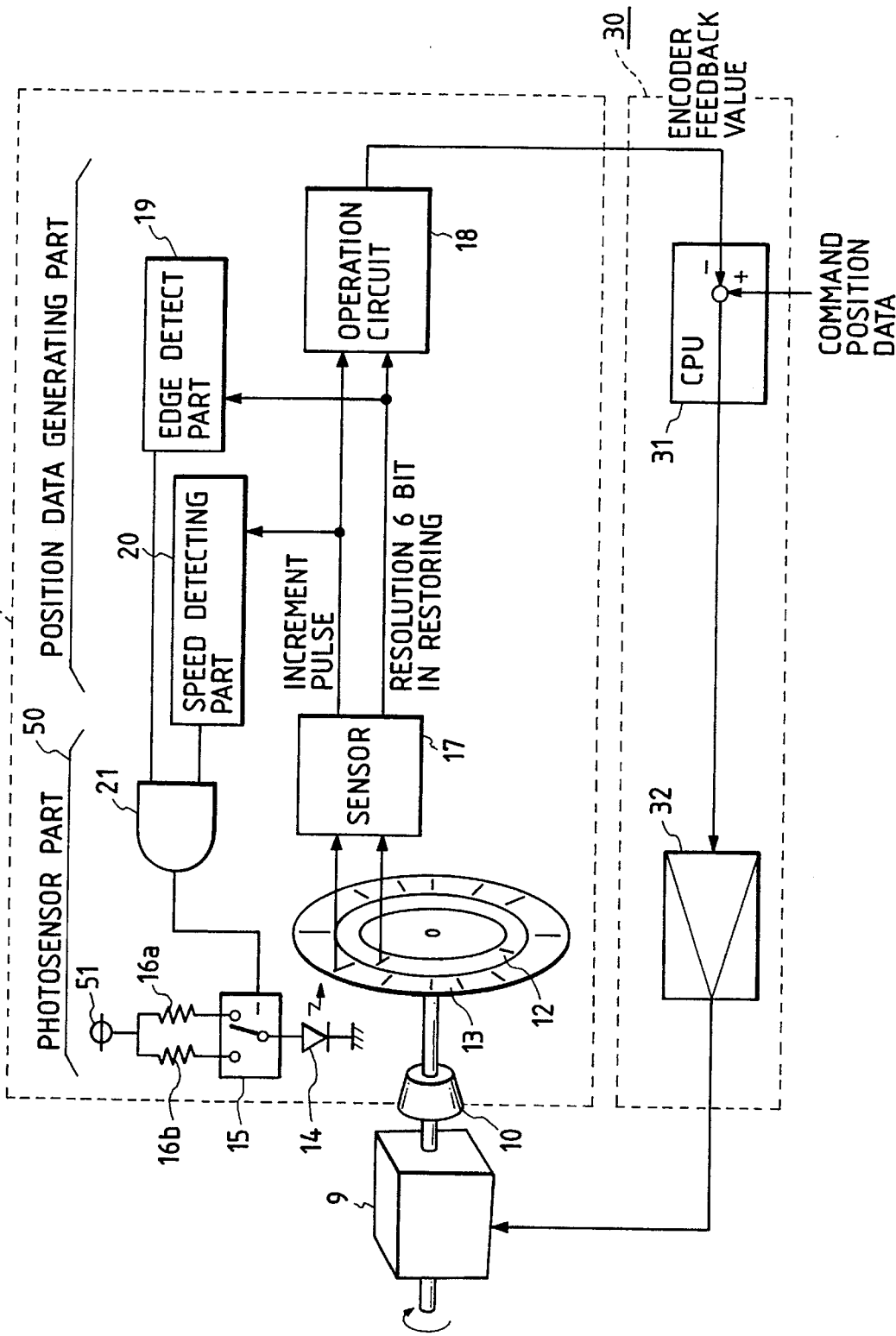

ABSOLUTE ENCODER AND METHOD OF GENERATING ITS CURRENT POSITION

BACKGROUND OF THE INVENTION

1. Field of the Invention

The present invention relates to an absolute encoder for use in a servo control device for driving the movable part of an industrial machine and a machine tool, and a method of generating the current position of the absolute encoder.

2. Description of the Background Art

In an environment where there is a motor driving shaft to move a load, it may be important to know precisely the position of the load. Information concerning the exact position is provided by an absolute encoder attached to the shaft. For example, where a motor is operative to rotate a shaft that drives a belt for lifting an object up or down, the motor may continue to rotate even where the absolute encoder device is off, and the motor can rotate an additional amount even where the motor itself is not energized, due to inertia. When the absolute encoder is commanded ON again and the motor is rotating, it is important to know the exact position of the motor.

In an absolute encoder which restores a value with limited resolution and then outputs a position of high resolution, there is employed a method which restores a current position at an arbitrary resolution of the absolute encoder, adds an increment pulse to the restored value for subsequent rotations, and sets a given value at the "edge" of the least significant bit of resolution in performing the restoration. Here, the "edge" means a time when the least significant bit is rising as the absolute encoder rotates in the forward direction or a time when the least significant bit is falling as the absolute encoder rotates in the backward direction.

The conventional absolute encoder is seen with reference to FIGS. 10 to 13, and in particular, FIG. 10 is a structural view of an entire absolute position detection system using an absolute encoder, FIG. 11 is a timing chart of bits detected by a photosensor part 50 shown in FIG. 10, and FIG. 12 is a graphical representation of the least significant bit signal level of resolution in the photosensor part 50 shown in FIG. 10. FIG. 13 is a flowchart showing a process for generating a current position.

In FIG. 10, reference character 8 designates an absolute encoder, 9 a motor, 10 a coupling which transmits the movement of the motor 9 to the absolute encoder 8, 11 a glass disk which rotates in synchronization with the motor 9, 12 a slit for a 6-bit resolution existing on the glass disk 11, 13 a slit for an increment pulse, 14 a light emitting source for illuminating the photosensor 50, 16 a resistance which adjusts the power from a power supply 51 to the light emitting source 14, 18 an operation circuit which converts the resolution 6 bits for restoring and an increment pulse respectively detected by the photosensor part 50 to output position data, 30 a servo amplifier, 31 a CPU which performs a feedback control by use of the output position data output from the operation circuit 18 and command position data from an external device such as a host controller and the like, and 32 an amplification circuit which amplifies a control command from the CPU 31 and supplies power to the motor 9.

In FIG. 11, a plurality of synchronized signals within the absolute encoder are shown, wherein b1 stands for the most significant bit of a resolution-in-restoring which is counted 2 per rotation of the absolute encoder, b2 a second bit of the resolution-in-restoring which is counted 4 per rotation of the absolute encoder, b6 the least significant bit of the resolution-in-restoring which is counted 64 per rotation of the absolute encoder. Also, with reference to signal b6, as shown in a magnified portion of the illustration, A and B are respectively the edges of the least significant bit, and i is an increment pulse which is counted at the greatest resolution per rotation of the absolute encoder.

Referring to FIG. 12, 40 designates the least significant bit signal waveform of a resolution-in-restoring in the photosensor part 50 for the low-speed rotation of the absolute encoder, 41 is the least significant bit signal waveform of the photosensor part 50 for the high-speed rotation of the absolute encoder, and d is the amount of error in the edge passage time of the least significant bit during the high-speed rotation of the absolute encoder.

In the above-mentioned absolute position detect system using an absolute encoder, it may be assumed that initially the motor 9 is at a standstill. At first, simultaneously when the power supply 51 of the absolute encoder 8 rises, the light emitting source 14 and sensor 17 start to operate.

The sensor 17 detects light passing through the resolution 6 bit slit 12 in restoring to thereby recognize the 6-bit data. However, the sensor does not recognize the change of the pulse from the increment pulse slit 13. On receiving the 6-bit data, the operation circuit 18 sets the output position data with 6-bit resolution.

Referring to the flowchart shown in FIG. 13 and the bit timing chart shown in FIG. 11, if a position is detected at a point D in step 101, then the 6-bit data ranging from b1 to b6 can be recognized. In the operation circuit 18, since only arbitrary positions in the range of an A point to a C point can be recognized, a central point value E between the points A and C is set as the output position data (step 102). The output position data is equivalent to the restored value of the absolute position detect system. Namely, at this time, the output position data includes a pulse error between the D point and the E point.

In a block in which the motor 9 is rotated in the forward direction and the absolute encoder reaches the point B, the operation circuit 18 adds the number of counts of the increment pulses i to the position data of the point E and sets the resultant value as the output position data (steps 103 to 105). Therefore, it can be said that the 6-bit resolution position including the error between D point and E point is being output even at the current time.

When the absolute encoder passes through the point B, the operation circuit 18 sets again a given value equivalent to the edge position as the output position data (steps 104, 109). From this time, the output position data become data which are of the most significant resolution level. Namely, the error between D point and E point is canceled. Following this time, in accordance with steps 110 to 111, by adding the number of counts of the increment pulses i to the position data at the point B, the output position data will be updated and output.

In addition, the following is an explanation in a case where the motor 9 rotates in the backward direction. The steps 101 and 102 are performed in a manner similar to that of the forward direction. The operation circuit 18 subtracts the number of counts of the increment pulses i from the position data of E point and sets the resultant value as the output position data (steps 106 to 108).

When the absolute encoder passes through the point A, the operation circuit 18 sets again a given value equivalent to the edge position as the output position data (steps 107, 109). Following this time, in accordance with steps 112 to 113, by subtracting the number of counts of the increment pulses i from the position data of E point, the output position data will be updated and output.

The servo amplifier 30 takes in the position data as the feedback value of the absolute encoder 8. The CPU 31 calculates a difference between the feedback value and the command position data and creates a control command which controls the feedback value to follow the command position data, and the amplifier circuit 32 converts the command position data to power and amplifiers the power so that power can be supplied to the motor 9.

Due to the fact that the conventional absolute encoder is constructed in the above-mentioned manner, after the rising of the power supply of the absolute encoder, the current position at the maximum resolution is reset at the first edge of the least significant bit of the resolution in a restoring operation. That is, the accuracy of the current position thus set has a direct influence on the accuracy of the following absolute position data. In a driving system using the absolute encoder, the power supply is begun when the motor is rotating at high speed. For example, it is a system in which the motor drives a falling item. In such a system, the waveform of the signal level of b6 in the sensor 17 of the absolute encoder, as shown in FIG. 12, is originally dull, that is, it is as shown by a waveform 40 which is obtained in the low-speed rotation of the absolute encoder. If the speed in the edge passing time is increased, then the edge is detected delayed by the time error d, as shown by a waveform 41 which is obtained in the high-speed rotation of the absolute encoder. That is, the number di of the pulses that have moved during the time error d are accumulated as the absolute position errors. Further, if the speed in the edge passing time is increased, the error of the absolute position is increased because the waveform 41 delays from the original waveform. Accordingly, the conventional absolute encoder has the following problems. If the motor 9 is rotating at the high speed when the power supply of the absolute encoder rises, then position shifting occurs in the absolute position. Further, the higher speed gets the larger amount of the error.

SUMMARY OF THE INVENTION

The present invention eliminates the above problems found in the conventional art. Accordingly, it is an object of the invention to provide an absolute encoder and a method of generating the current position of the absolute encoder which can prevent or correct the position shifting of the absolute position occurring at the rise of the absolute encoder while a rotary device such as a motor and the like is rotating at a high speed.

In particular, according to the first embodiment of the invention, an internal circuit of an absolute encoder is used to detect the rotational speed of the absolute encoder and, when the rotational speed goes below a given rotational speed, to set a given value at the edge of the least significant bit of resolution in restoring. Thanks to this, only by adding a simple algorithm, it is possible to build an absolute position detect system of a high accuracy without causing any position shifting even if the power supply of the absolute encoder is put to work at a high speed rotation.

According to the second embodiment, an internal circuit of an absolute encoder is used to detect the rotational speed of the absolute encoder and to set a given value every time at the edge of the least significant bit of resolution in restoring until the rotational speed goes below a given rotational speed. Due to this, as the rotational speed is decreased, position shifting is decreased by stages and, even when the power supply of the absolute encoder is put to work at a high speed rotation, it is possible to prevent sudden change of the position change quantity and thus to correct the position shifting.

According to the third embodiment, after receipt of a signal from a servo amplifier, an internal circuit of an absolute encoder is used to set a given value at the edge of the least significant bit of resolution in restoring. This makes it possible for the servo amplifier to correct position shifting at an arbitrary timing and also this can obtain a method which can be applied widely.

According to the fourth embodiment, by increasing the light quantity of a photosensor part only during a block ranging from the start of a power supply of an absolute encoder to the edge of the least significant bit of resolution in the first restoration, the edge of the least significant bit of resolution in restoring can be made to resemble a square wave. Due to this, in setting a given value when the absolute encoder passes through the edge, no position shifting can occur at all and the given value can be set with such an accuracy as near as the maximum resolution accuracy according to a highly reliable method.

According to the fifth embodiment, by increasing the light quantity of a photosensor part only when the rotational speed of the absolute encoder is equal to or greater then a given value between the initiation of the power supply of the absolute encoder and the edge of the least significant bit of resolution of the first restoration, the edge of the least significant bit of resolution in restoring can be made closer to a square wave. This can reduce the possibility of increasing the light quantity and thus can save the power consumption when compared with the fourth embodiment.

According to the sixth embodiment, when setting a given value at the edge of the least significant bit of resolution in restoring by use of an internal circuit of an absolute encoder, a correction quantity corresponding to the then rotational speed of the absolute encoder can be added within the absolute encoder, so that the quantity of position shifting can be corrected quickly.

According to the seventh embodiment, when setting a given value at the edge of the least significant bit of resolution in restoring in an absolute encoder, the correction quantity corresponding to the then rotational speed is output is an external control device and position shifting is corrected arbitrarily by the external control device. This makes it possible to realize a position shift correcting method which has a diversity of correcting operations.

BRIEF DESCRIPTION OF THE DRAWINGS

FIG. 1A is a timing chart of a first embodiment according to the invention;

FIG. 2A is a timing chart of a second embodiment according to the invention;

FIG. 5 is a structure view of the whole of an absolute value detect system in a fourth embodiment according to the invention;

FIG. 6 is a structure view of the whole of an absolute value detect system in a fifth embodiment according to the invention;

DESCRIPTION OF THE PREFERRED EMBODIMENTS

EMBODIMENT 1

Figure 1B:
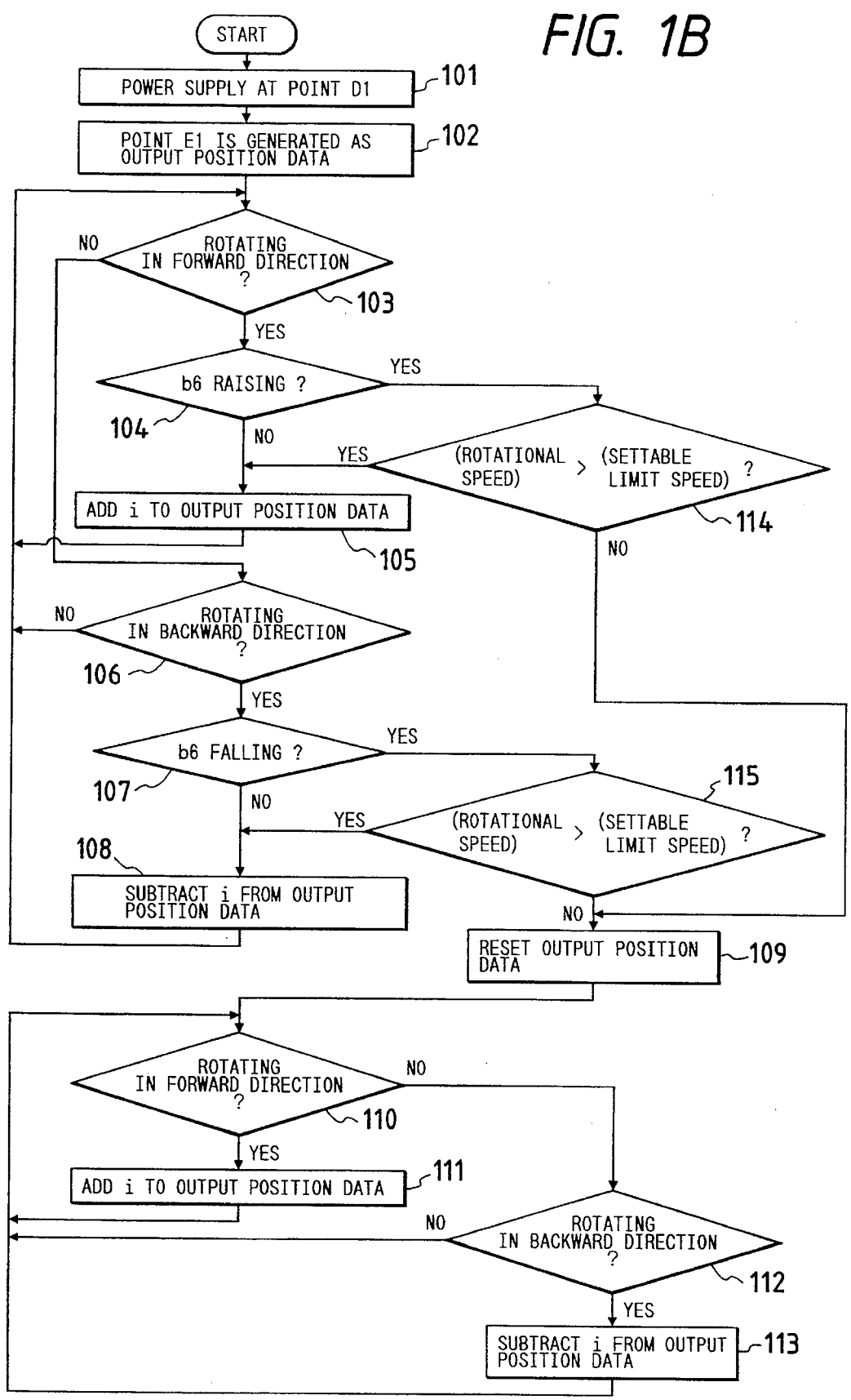
FIG. 1B is a flowchart showing an order of generating a current position of first embodiment of the present invention.
Figure 1C:
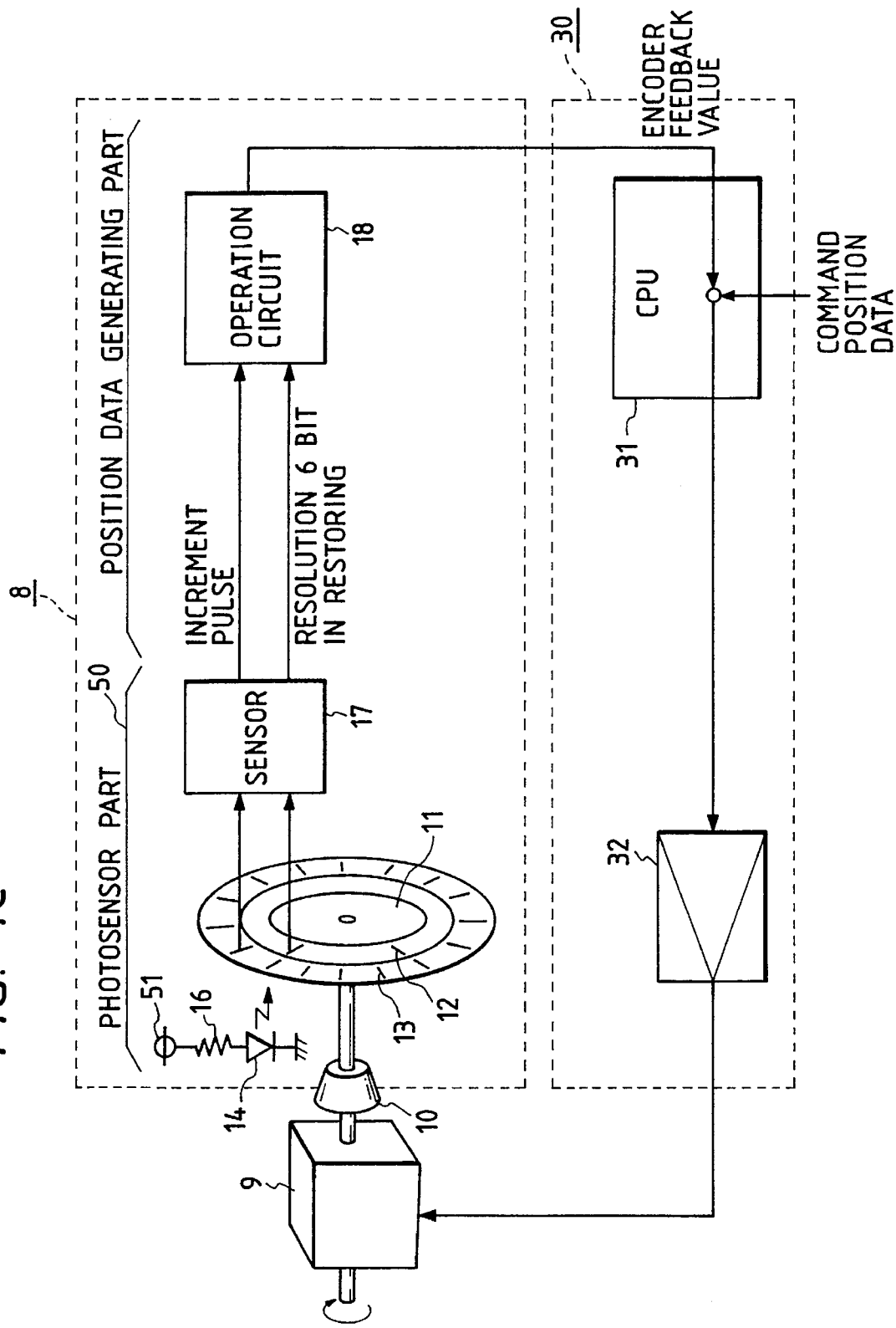
FIG. 1C is a structure view of the whole of an absolute value detect system in a first embodiment according to the invention.
Figure 10:
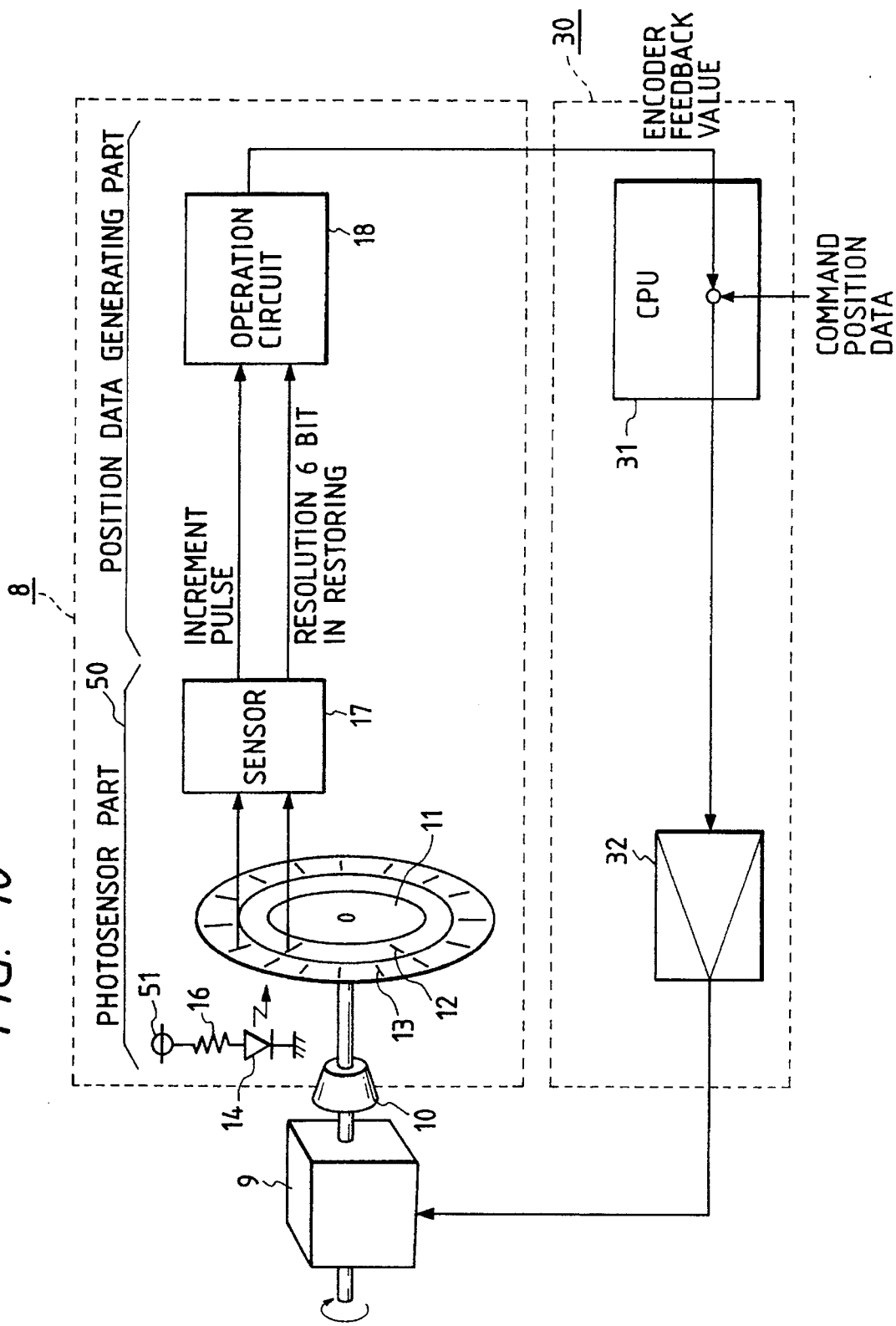
FIG. 10 is a structure view of the whole of a conventional absolute position detect system.
Figure 11:
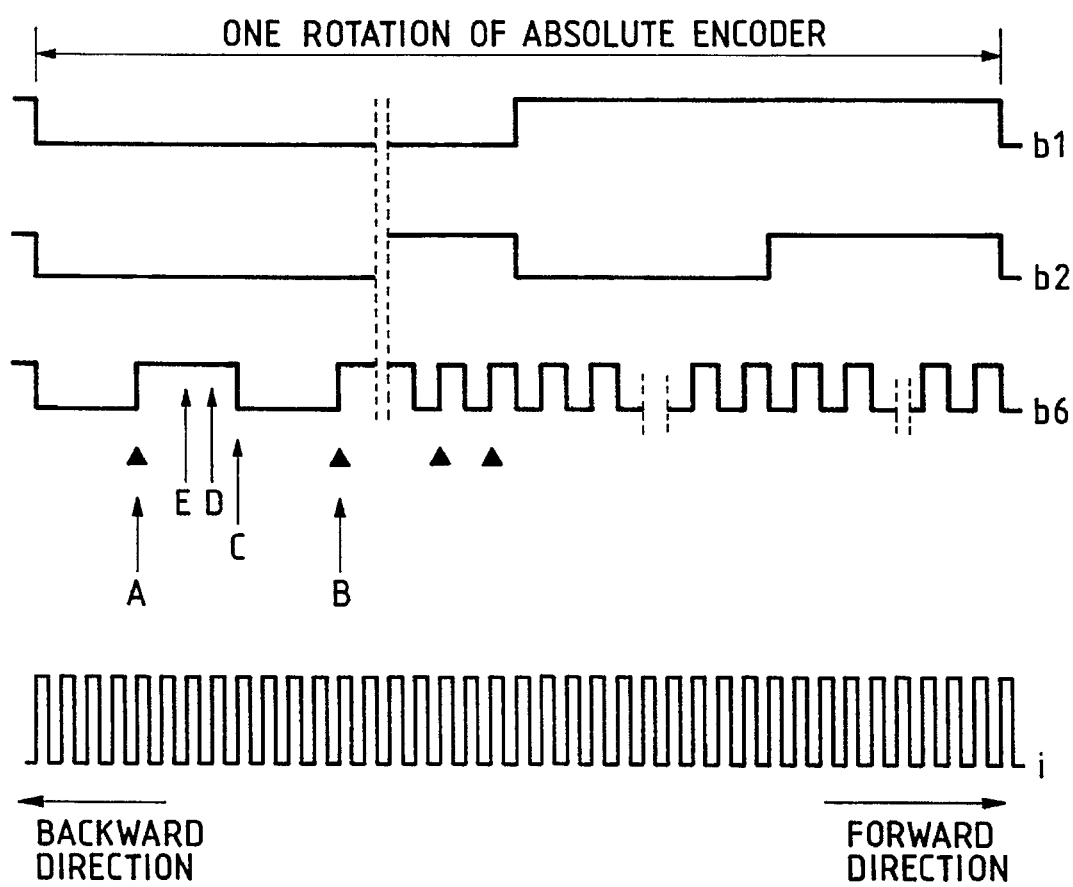
FIG. 11 is a timing chart of bits detected by a conventional photosensor part.

A description will be given below of a first embodiment of the invention with reference to FIGS. 1A, 1B, and 1C. FIG. 1A is a timing chart of a method according to the present invention showing several related signals. FIG. 1B is a flowchart showing an order of generating a current position. In FIG. 1C, a system diagram of the first embodiment of the invention, the same or equivalent parts to the conventional system shown in FIG. 10 are given the same designations and the description thereof is omitted here.

In FIG. 1A, reference character 1 designates a graph which represents a relationship between a rotational speed detected by the absolute encoder and time, and a point 2 shown in the graph 1 stands for the maximum settable limit speed at which the position shifting is not generated when a given value is set at the edge of the least significant bit of the resolution in restoring. Also, 3 designates a block in which a given value is not set at the edge of the least significant bit of resolution in restoring, 4 stands for a block in which a given value is set at the edge of the least significant bit of resolution in restoring, and b6 represents the least significant bit of the resolution in restoring. Also, A1, B1, C1, F1 and G1 respectively designate the edges of the least significant bit b6, and i designates a series of increment pulses.

Referring to FIG. 1C, 18A represents an operation circuit which has a function to detect a rotational speed from an increment pulse detected from the photosensor part 50 and also which converts the resolution 6 bit in restoring and the increment pulse into output position data. The operation circuit 18A is always monitoring the rotational speed and, if the rotational speed when the least significant bit passes the edge does not exceed the settable limit speed 2, then the operation circuit 18A sets again a given value equivalent to the edge position as the output position data. The servo amplifier 30 operates in response to the output of the operation circuit 18A the same manner as described for the conventional art.

Turning now to FIG. 1B, in step 101, if the power supply 51 is caused to rise when the absolute encoder is present at a point D1, then the position of a point E1 is set as the output position data in the operation circuit 18A (step 102).

In a block in which the motor 9 is rotated in the forward direction and the absolute encoder reaches the point B1, the operation circuit 18A adds the number of counts of the increment pulses 1 to the position data at the point E1 and thus sets the resultant value as the output position data (steps 103 to 105)

In step 104, if the absolute encoder reaches the point B1, then the operation circuit 18A checks the rotational speed of the absolute encoder (step 114) and does not reset the output position data at the edge position because the rotational speed checked is greater then the settable limit speed 2 (b6 edge unsettable block 3). Also, the output position data remains in a state in which the number of counts of the increment pulses i are added to the position data at the point E1 and the resultant is output (step 105).

Further, even if the absolute encoder reaches the point C1, similarly to the above, the output position data is not reset at the edge position (b6 edge unsettable block 3) (steps 103, 104, 114, 105).

After then, if the rotational speed goes below the settable limit speed 2 and the absolute encoder reaches the point F1, then a given value equivalent to the edge position is reset as the output position data (b6 edge settable block 4) (step 109). From that time on, the output position data becomes the data of the maximum resolution level. Also, thereafter, the output position data are updated and output by adding the number of counts of the increment pulses i to the position data at the point F1 (steps 110, 111).

Even if the absolute encoder passes through the point G1 and the like, the output position data is net reset at the edge position.

In addition, an explanation of a case where the rotational speed has already gone below the settable limit speed 2 when the power supply is caused to rise will be described as follows, again referring to the flowchart of FIG. 1B. In step 101, the power supply is caused to rise at point D1 so as to generate point E1 as an output position data (step 102). Then, the absolute encoder reaches point B1 by rotating in the forward direction, and it passes through steps 104 and 114 so as to reset the output position data in step 109.

EMBODIMENT 2

Figure 2B:
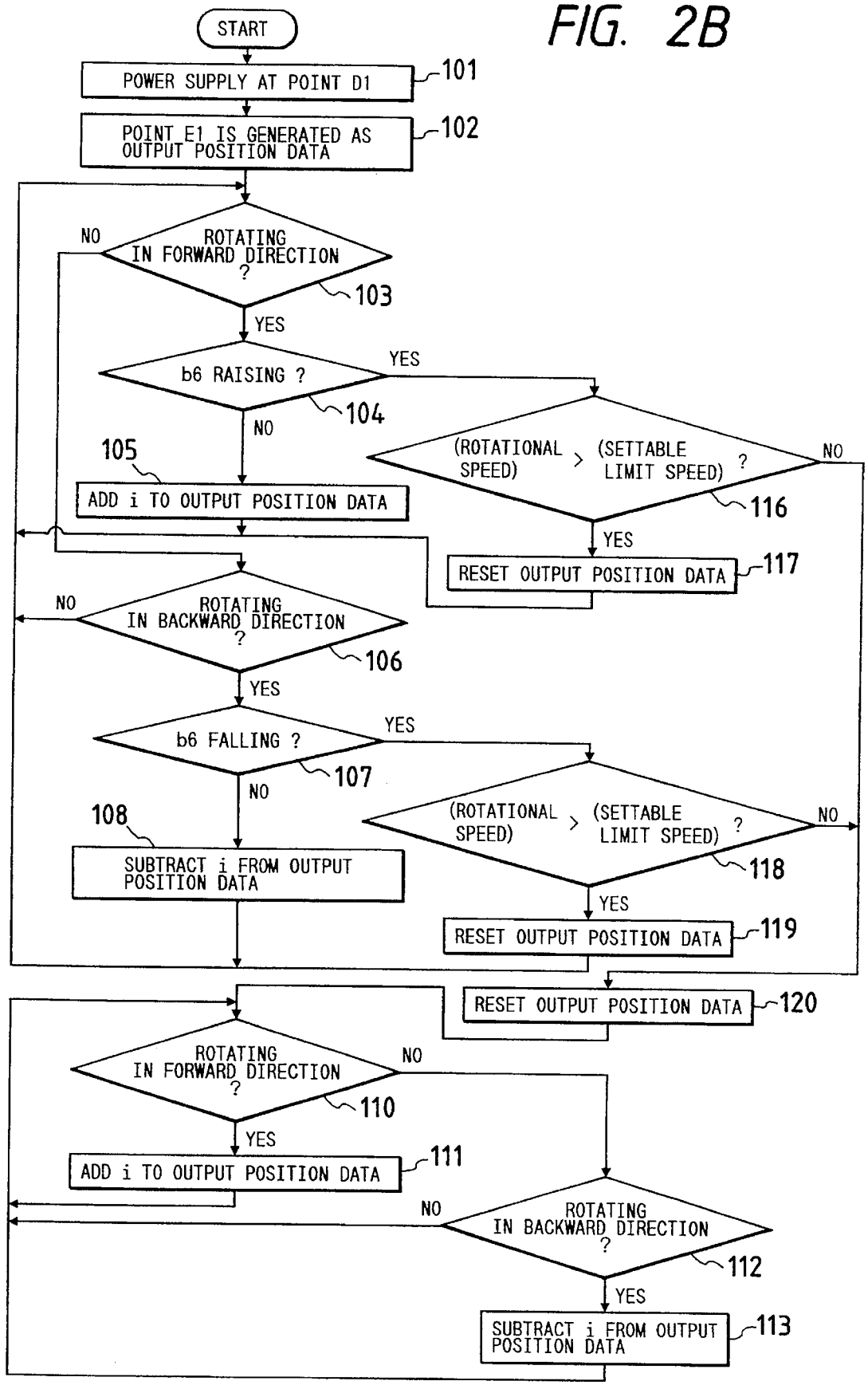
FIG. 2B is a flowchart showing an order of generating a current position of second embodiment of the present invention.
Figure 2C:
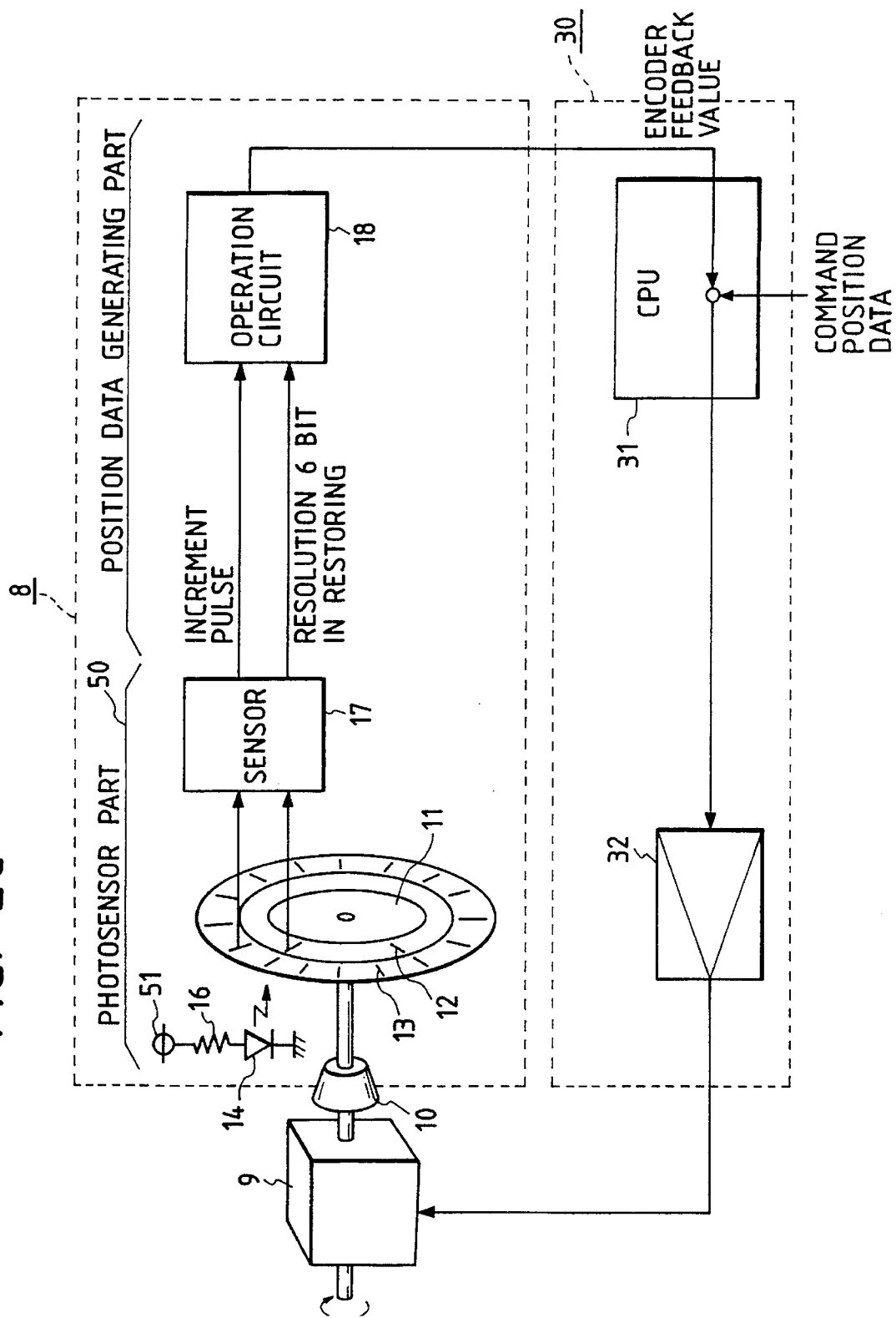
FIG. 2C is a structure view of the whole of an absolute value detect system in a second embodiment according to the invention.

Next, a description will be given below of a second embodiment according to the invention with reference to FIGS. 2A, 2B, and 2C. FIG. 2A is a timing chart of a second embodiment of a method according to the invention. FIG. 2B is a flowchart showing a generating order of a current position. In FIGS. 2A, 2B and 2C, similar and equivalent parts to those of the first embodiment shown in FIGS. 1A, 1B and 1C are given the same designations and the description thereof is omitted here. In the figure, reference character 18B designates an operation circuit which always monitors the rotational speed of the absolute encoder and also which, if the rotational speed of the absolute encoder when it passes through the edge of the least significant bit does not exceed the settable limit speed, then resets a given value corresponding to the edge position as the output position data thereof.

Referring to FIGS. 2B and 2C, in step 101, if the power 51 is caused to rise when the absolute encoder is situated at a point D1, then the position of a point E1 is set as the output position data in the operation circuit 18B (step 102).

During a block in which if the motor 9 is rotated in the forward direction and the absolute encoder reaches a point B1, the operation circuit 18B adds the number of counts of the increment pulses i to the position data of the point E1 to set the resultant value as the output position data thereof (steps 103 to 105).

In step 104, if the absolute encoder reaches the point B1, then the operation circuit 18B checks the rotational speed of the absolute encoder (step 116) and, because the rotational speed is greater than the settable limit speed, the operation circuit 18B resets a given value equivalent to the edge position as the output position data (b6 edge settable block 4) (step 117). Here, the position data is data in a maximum resolution level in spite of including an error with respect to passing through the edge in the high speed. From that time on, the output position data are updated and output by adding the number of counts of the increment pulses i (step 105) to the position data of a point F1.

Further, if the absolute encoder reaches a point C1, then the operation circuit 18B resets a given value equivalent to the edge position as the output position data similarly to the point B1 because the rotational speed is still greater than the settable limit speed 2 (b6 edge settable block 4) (step 117). Also, at this C1 point, the position data includes an error with respect to passing through the edge in the high speed. However, the error at C1 point is less than the error at B1 point, because the speed at C1 point is slower than the speed at B1 point. From that time on, the output position data are updated and output by adding the number of counts of the increment pulses i (step 105) to the position data at the point C1.

After that, if the rotational speed goes below the settable limit speed 2 and the absolute encoder reaches the point F1, then the operation circuit resets the output position data (step 120) so as to correspond to a given edge position value similarly to the point C1 and, from that time on, the output position data are updated and output by adding the number of counts of the increment pulses i to the position data of the point F1 (b6 edge unsettable block 3) (steps 110, 111).

After that, even if the absolute encoder passes through a point G1 and the like, resetting of the output position data at the edge position will never be executed.

In the second embodiment, if the rotation speed is decreased, whenever passing through the edge, the error decreases less and less.

In addition, an explanation of a case where the rotational speed has already gone below the settable limit speed 2 when the power supply is caused to rise will be described as follows referring again to the flowchart of FIG. 2B. In step 101, the power supply is caused to rise at point D1 so as to generate point E1 as an output position data (step 102). Then, the absolute encoder reaches point B1 by rotating in the forward direction, then it passes through steps 104 and 116 so as to reset the output position data in step 120.

EMBODIMENT 3

Figure 3:
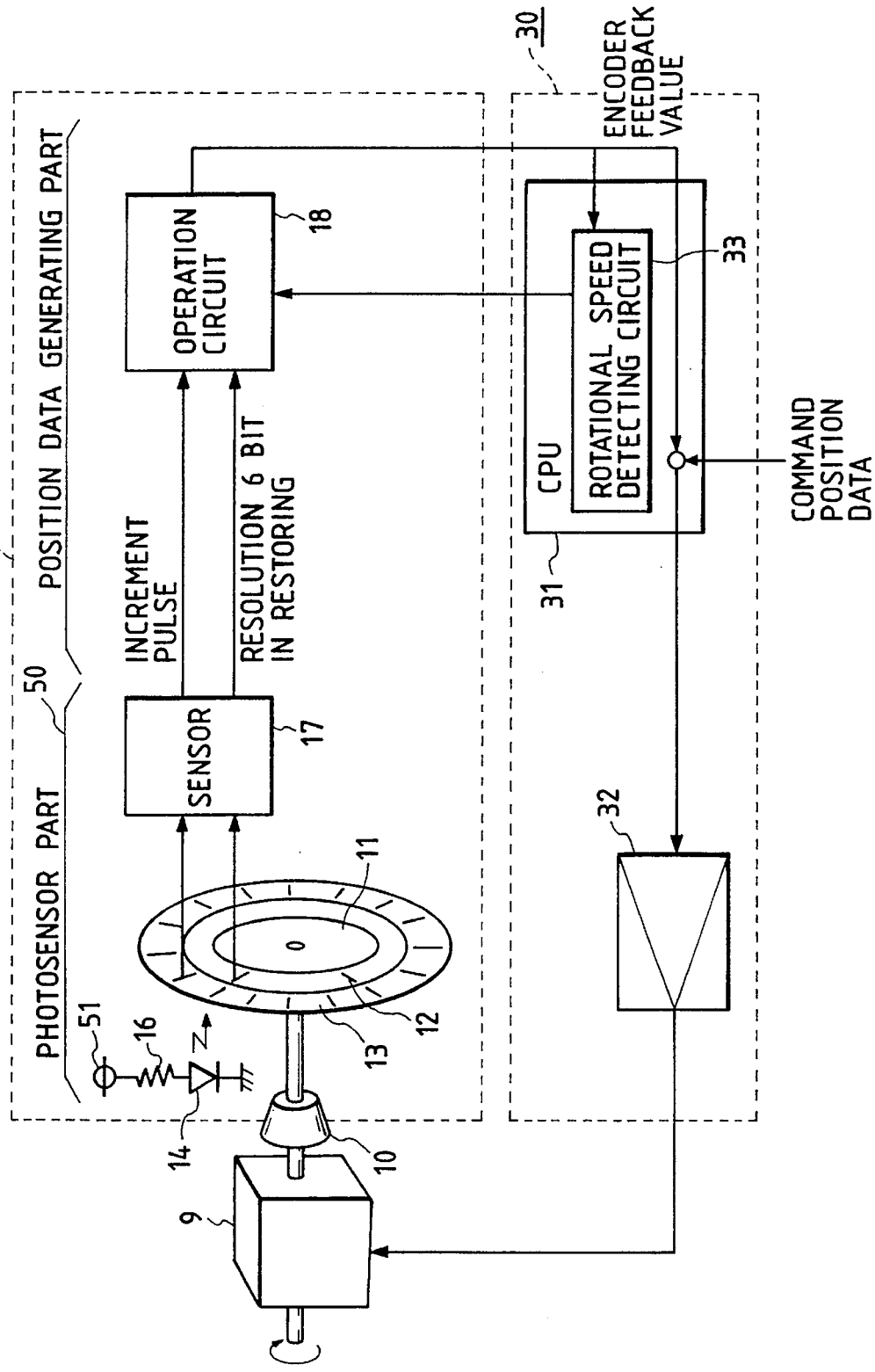
FIG. 3 is a structure view of the whole of an absolute value detect system in a third embodiment according to the invention.
Figure 4A:
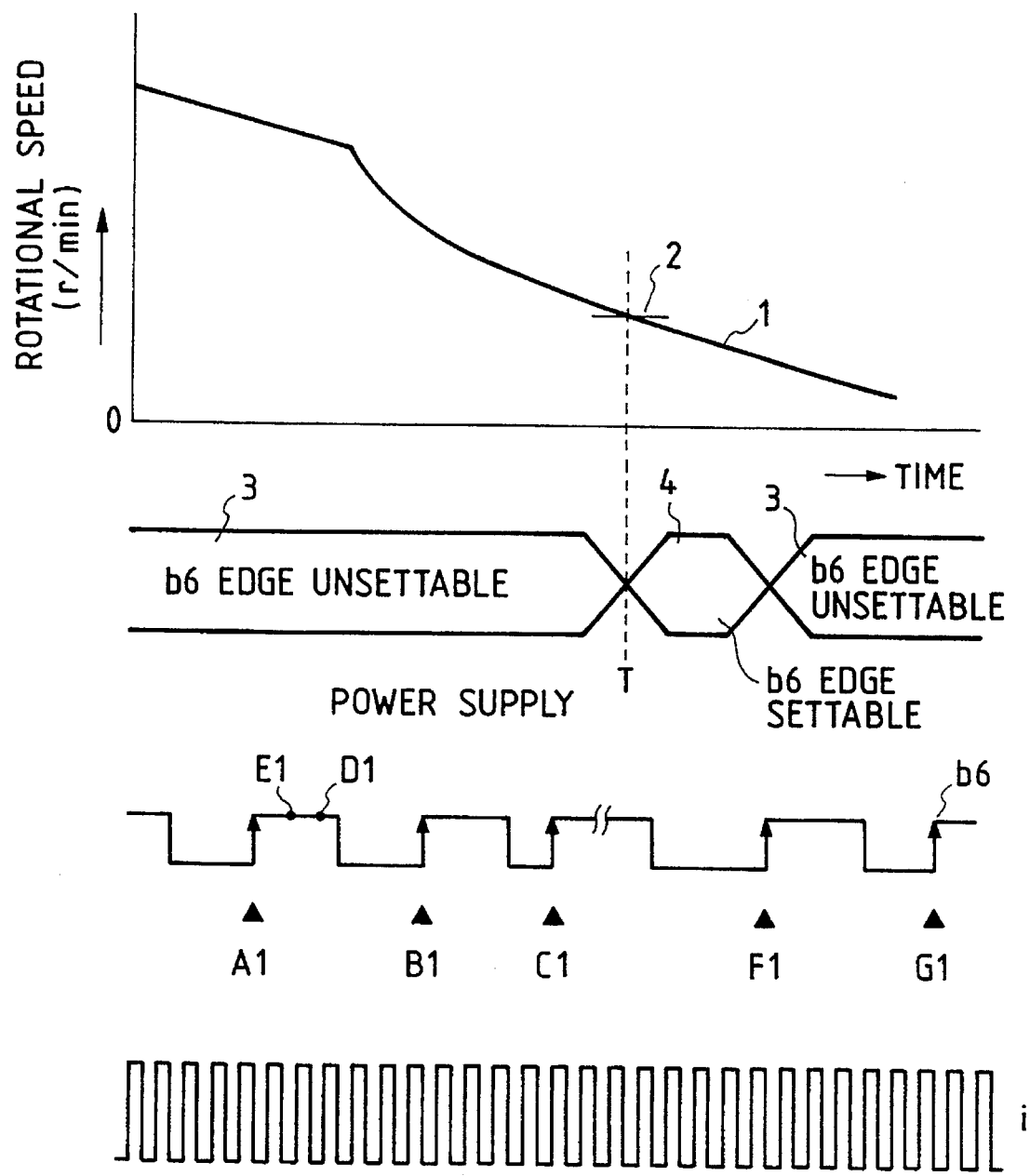
FIG. 4A is a timing chart of the third embodiment according to the invention.
Figure 4B:
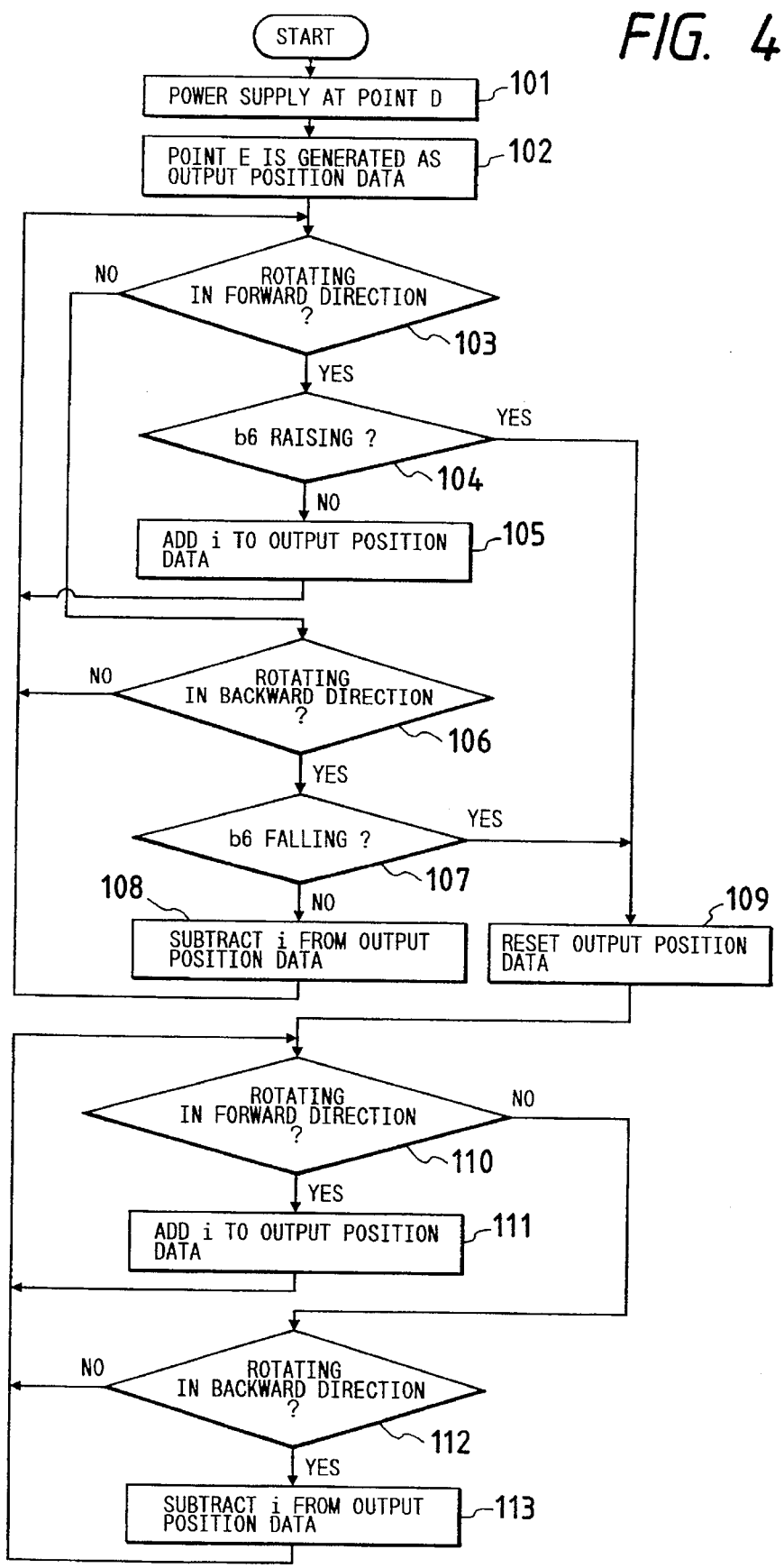
FIG. 4B is a flowchart showing an order of generating a current position of third embodiment of the present invention.

Next, a description will be given below of a third embodiment according to the invention with reference to FIGS. 3, 4A and 4B. FIG. 3 is an illustration of an entire absolute position system using an absolute encoder employed in a third embodiment according to the invention. In FIG. 3, the same or equivalent parts to the conventional system shown in FIG. 10 are given the same designations and the description thereof is omitted here. FIG. 4A is a timing chart of another embodiment according to the invention, in which similar or equivalent parts to those employed in the first embodiment shown in FIG. 1A are given the same designations and the description thereof is omitted here. FIG. 4B is a flowchart showing a generating order of a current position. In FIG. 3, reference character 32 designates a rotational speed detecting unit which receives the output position data from the absolute encoder 8 to thereby detect a rotational speed. Reference character 31C designates a CPU of a servo amplifier 30C having a monitoring unit which monitors the rotational speed detecting unit to transmit a signal to the absolute encoder 8, only on time when the detected rotational speed is smaller than the settable limit speed 2. Further, after receipt of a signal from the servo amplifier 30C, an operation circuit 18C resets a given value corresponding to the edge position as the output position value when the absolute encoder passes through the first edge of the least significant bit of a resolution in restoring.

Referring to FIG. 4B, in step 101, if the power supply 51 is caused to rise when the absolute encoder 8 is situated at the point D1, then the position of the point E1 is set as the output position data in the operation circuit 18C (step 102).

During a block in which the motor 9 is rotated in the forward direction and the absolute encoder 8 reaches the point B1, the operation circuit 18C adds the number of counts of the increment pulses i to the position data of the point E1 and sets the resultant value as the output position data (step 105).

If the absolute encoder 8 reaches the point B1, then the servo amplifier 30C does not transmit any signal because the rotational speed is greater than the settable limit speed 2 (b6 edge unsettable block 3). Also, because the operation circuit 18C has not received any signal, the output position data remains in the same state that the number of counts of the increment pulses i is added to the position data of the point E1 and the resultant value is output (passing through steps 103, 121, 105).

Further, even if the absolute encoder 8 reaches the point C1, similarly, resetting of the output position data at the edge position is not executed (b6 edge unsettable block 3).

After then, if the rotational speed goes below the settable limit speed 2 and the absolute encoder reaches a point T, then the servo amplifier 30C transmits a signal to the absolute encoder 8 and thus the absolute encoder 8 waits for the edge of the next least significant bit (b6 edge settable block 4) (step 104).

If the absolute encoder reaches the point F1, then the operation circuit 18C resets a given value equivalent to the edge position as the output position data (step 109). From that time, the output position data becomes the data of the maximum resolution level. From that time on, the output position data will be updated and output by adding the number of counts of the increment pulses i to the position data of the point F1 (b6 edge unsettable block 3) (steps 110, 111).

After that, even if the absolute encoder passes through points such as a point G1 and the like, resetting of the output position data at the edge position will not be executed any longer.

In addition, an explanation of a case where the rotational speed has already gone below the settable limit speed 2 when the power supply is caused to rise will be described as follows referring with a flowchart of FIG. 4B. In step 101, the power supply is caused to rise at point D1 so as to generate point E1 as an output position data (step 102). Then, the absolute encoder reaches point B1 by rotating in the forward direction, then it passes through steps 103, 121 and 104 so as to reset the output position data in step 120.

EMBODIMENT 4

Next, a description will be given below of a fourth embodiment according to the invention with reference to FIGS. 5 and 12. FIG. 5 is an illustration of an entire absolute position detect system using an absolute encoder illustrated as a fourth embodiment according to the invention. In FIG. 5, similar and equivalent parts to those employed in the conventional system are given the same designations and the description thereof is omitted here. In particular, the operation circuit may be any of the conventional circuit 18 or the improved circuits 18A–18C of the previous embodiments. In FIG. 5, reference character 15 designates a light quantity selector, 16a a standard resistance, 16b a light quantity increasing resistance, and 19 an arbitrary bit edge detector which detects the edge of a resolution 6 bit in restoring and transmits a switching signal to the light quantity selector 15.

Figure 12:
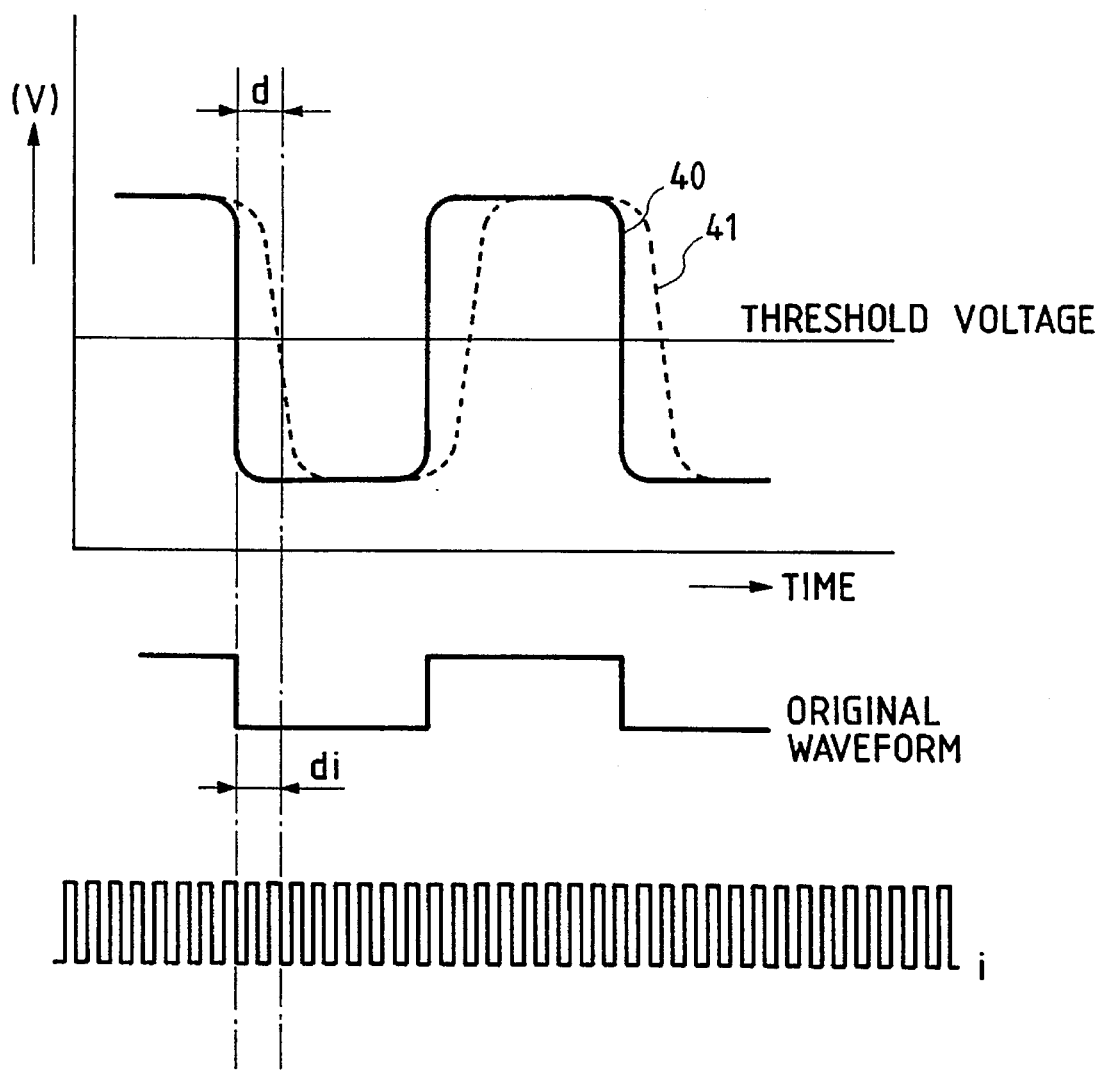
FIG. 12 is a graphical representation of the least significant bit signal level of resolution in restoring in the conventional photosensor part.
Figure 13:
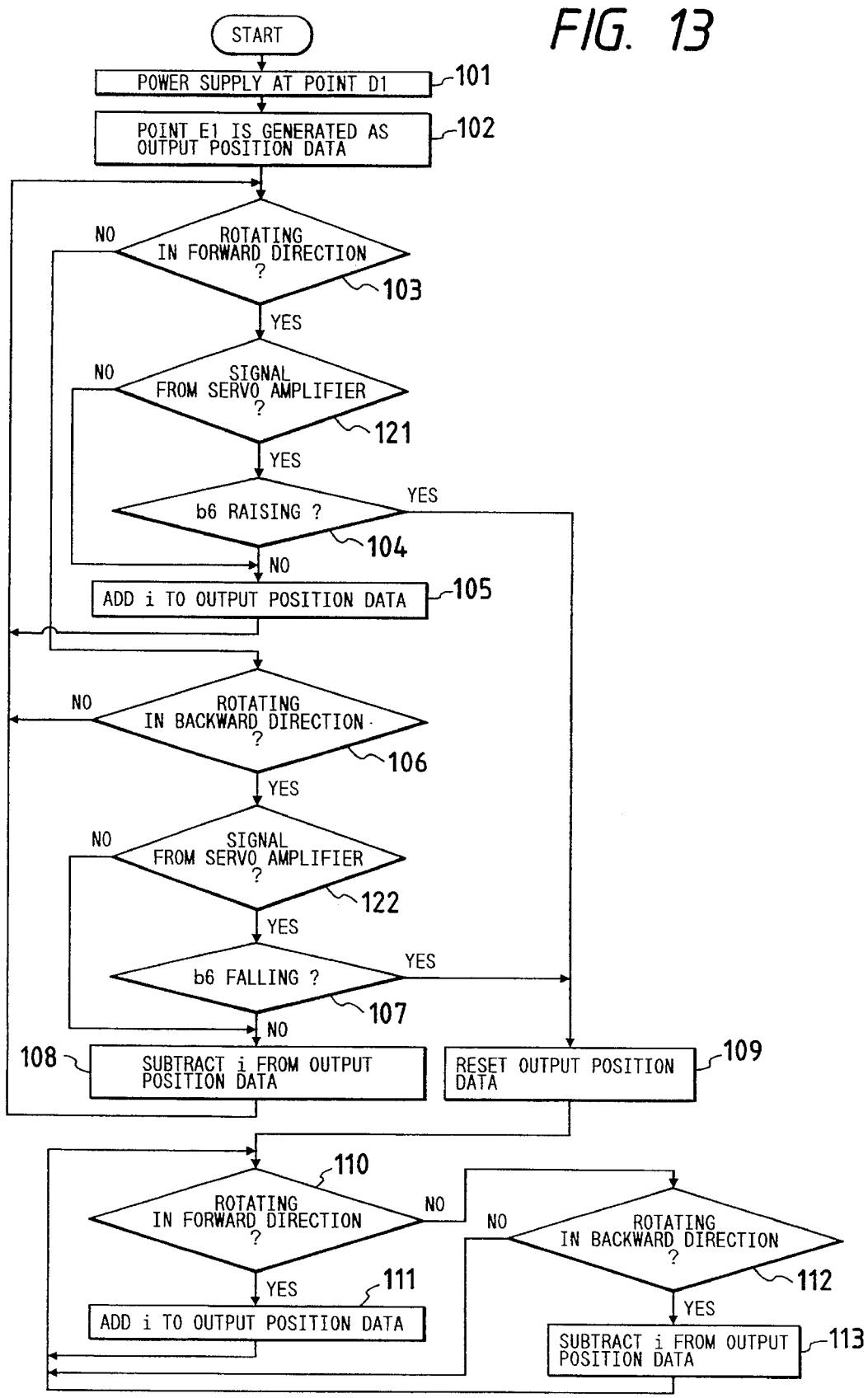
FIG. 13 is a flowchart of a conventional absolute encoder.

When the motor 9 is rotating at high speeds, the signal waveform of the least significant bit of resolution in restoring in the photosensor part 50 is dull like a waveform 41 for the high speed rotation as shown in FIG. 12. However, if the quantity of light of the light emitting source 14 is increased, then the signal waveform can be made to approach a waveform 40 for the low speed rotation. Taking these into consideration, the fourth embodiment will be described below in detail.

The light quantity selector 15 initially selects the light quantity increasing resistance 16b. At first, if the power supply of the absolute position detect system using the absolute encoder is put to work, then the quantity of light of the light emitting source 14 is set greater than a standard light quantity and this state continues until the edge of the least significant bit of the resolution in restoring is detected by the edge detect part 19.

When the edge detect part 19 detects the edge and sets a given value, the signal waveform of the least significant bit of the resolution in restoring in the photosensor part 50 is close to the waveform 40 for the low speed rotation as shown in FIG. 12 because the light quantity of the light emitting source 14 is large.

If the edge is detected by the edge detect part 19, then a switching signal is transmitted to the light quantity selector 15 to select the standard resistance 16a, so that the light quantity of the light emitting source 14 is allowed to go into a standard state similar to the conventional system. In doing so, even if the absolute encoder passes through the edge of the least significant bit at the high speed rotation thereof, it is possible to obtain the same result as if the absolute encoder passed at the low speed rotation.

EMBODIMENT 5

Next, a description will be given below of a fifth embodiment according to the invention with reference to FIGS. 6 and 12. FIG. 6 is an illustration of the whole of an absolute position detect system using an absolute encoder shown as the fifth embodiment of the invention. In FIG. 6, similar and equivalent parts to those shown in FIG. 5 as the fourth embodiment are given the same reference designations and the description thereof is omitted here. In FIG. 6, reference character 20 designates a speed detect part which detects the rotational speed of the absolute encoder from the increment pulses and, if the detected rotational speed is greater than a given rotational speed, then outputs a signal, and 21 identifies an AND circuit which outputs the AND of the signals of the edge detect part 19 and speed detect part 20 to the light quantity selector 15.

While the absolute encoder is rotating at a speed greater than a given rotational speed, if the power supply of the absolute position detect system is put to work, then the AND circuit 21 receives from the speed detect part 20 a signal indicating that the rotational speed of the absolute encoder is greater than the given rotational speed and a signal indicating that the edge detect part 19 has not detected the edge, and outputs a signal to the light quantity selector 15 to select the light quantity increasing resistance 16b. At the then time, the light quantity of the light emitting source 14 is set greater than a standard quantity, and this state continues until the edge detect part 19 detects the edge of the least significant bit of resolution in restoring or until the rotational speed of the absolute encoder goes below the given rotational speed and the detect part 20 detects it.

When the edge detect part 19 detects the edge and sets a given value, the signal waveform of the least significant bit of resolution in restoring in the photosensor provides a waveform similar to such a waveform 40 as shown in FIG. 12 which is obtained in the low speed rotation.

Also, if the edge detect part 19 detects the edge or if the rotational speed goes below the given rotational speed and the speed detect part 20 detects it, then the AND circuit 21 cancels the signal applied to the light quantity selector 15 to thereby select the standard resistance 16a and, as a result, the light quantity of the light emitting source 14 is turned to a standard state similar to the conventional system.

EMBODIMENT 6

Figure 7:
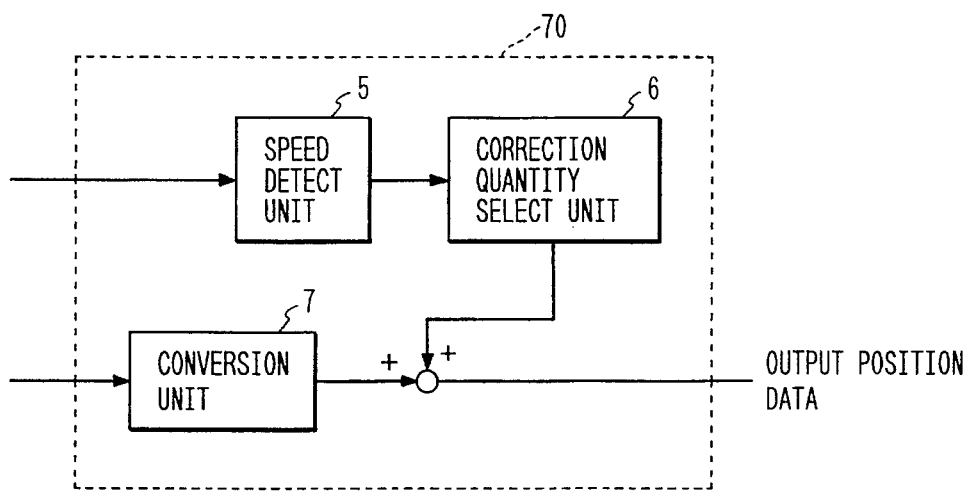
FIG. 7 is a view of the operation of an operation circuit in an instant in which it sets a given value at the edge of the least significant bit of resolution in restoring in a sixth embodiment according to the invention.

Next, a description will be given below of a sixth embodiment according to the invention with reference to FIG. 7. FIG. 7 is a view of the operation of an operation circuit in an instant in which the operation circuit sets a given value at the edge of the least significant bit of resolution in restoring. In FIG. 7, reference character 70 designates an operation circuit employed in the absolute encoder 8, 5 is a speed detect unit for detecting the rotational speed of the absolute encoder from the increment pulses, 6 is a selecting unit for selecting a correction quantity corresponding to the speed detected, and 7 is a conversion unit for converting a resolution 6 bit in restoring into a given value equivalent to the edge of the least significant bit.

When the power supply of the absolute position detect system is put to work and the absolute encoder passes through the first edge of the least significant bit of resolution in restoring, if the absolute encoder is rotating at a high speed, then the high speed rotation causes the absolute position data to be shifted in position. The quantity of this position shifting is previously estimated and the estimated position shift quantity is also previously registered in a correction quantity select portion (not shown) of the correction quantity select unit 6.

When the absolute encoder passes through the first edge of the least significant bit of resolution in restoring, the rotational speed of the absolute encoder is detected by the speed detect unit 5 and the correction quantity is determined by the correction quantity select unit 6.

A given value equivalent to the edge position converted by the conversion unit is added to the thus determined correction quantity and the resultant value is set as the output position data.

EMBODIMENT 7

Figure 8:
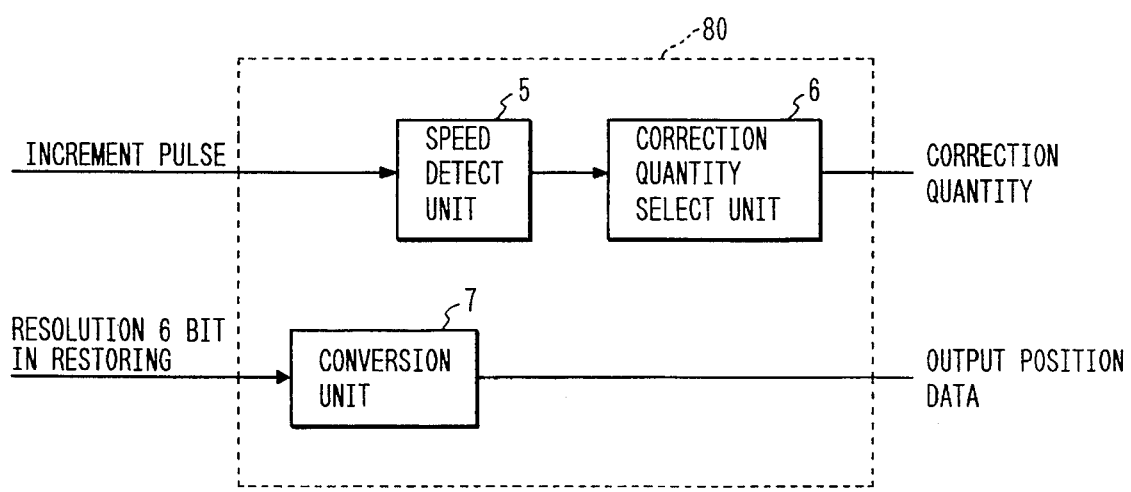
FIG. 8 is a view of the operation of an operation circuit in an instant in which it sets a given value at the edge of the least significant bit of resolution in restoring in a seventh embodiment according to the invention.
Figure 9:
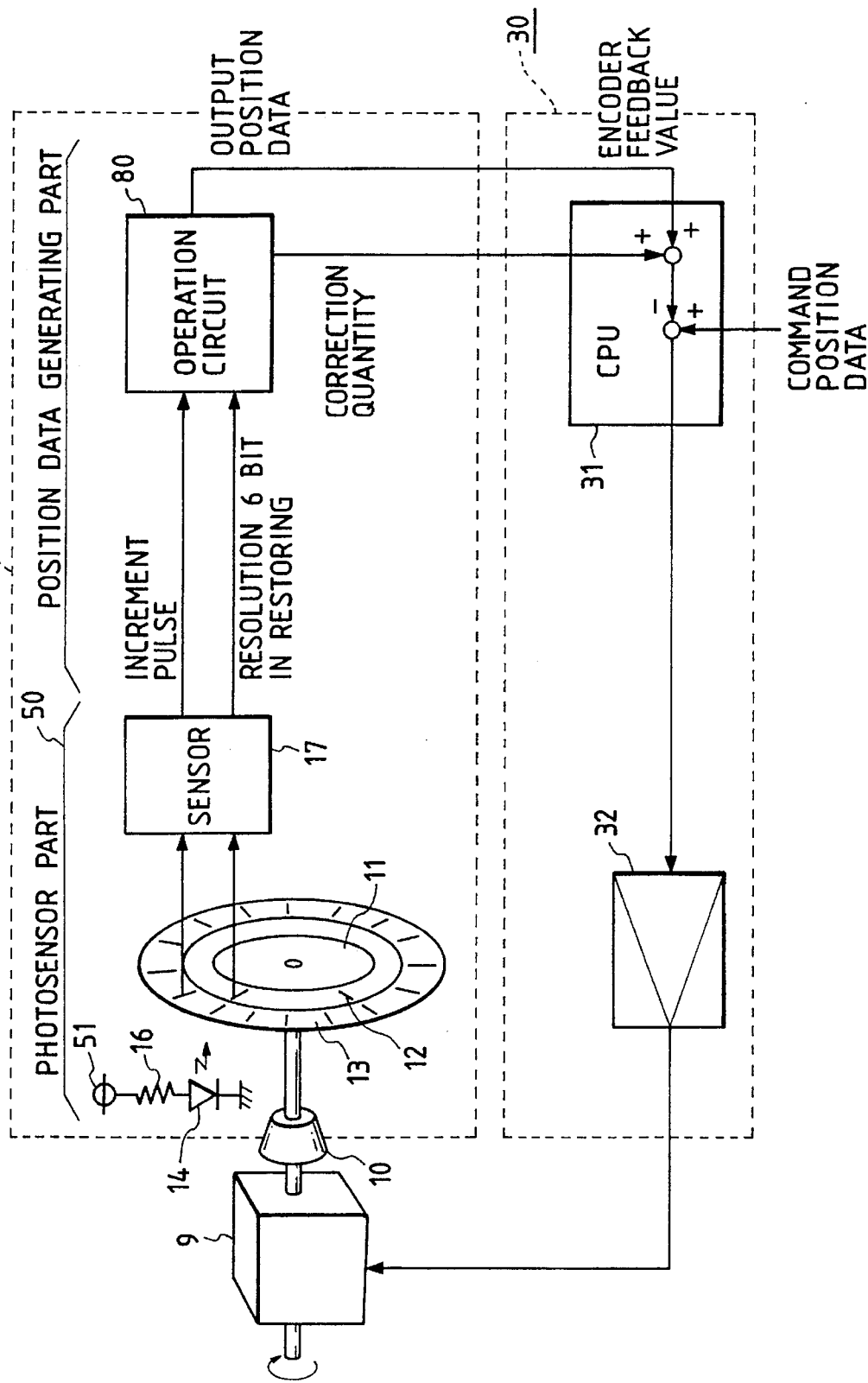
FIG. 9 is a structure view of the whole of an absolute position detect system in the seventh embodiment according to the invention.

Next, description will be given below of a seventh embodiment according to the invention with reference to FIGS. 8 and 9. FIG. 8 is a view of the operation of an operation circuit in an instant in which it sets a given value at the edge of the least significant bit of resolution in restoring. In FIG. 8, similar and equivalent parts to those shown in FIG. 7 are given the same designations and the description thereof is omitted here. FIG. 9 is an illustration of an absolute position detect system using an absolute encoder 8. If FIG. 9 as well, similar and equivalent parts to those employed in the conventional system shown in FIG. 10 are given the same designations and the description thereof is omitted here.

Similarly to the sixth embodiment, the shift quantity corresponding to the rotational speed of the absolute encoder when it passes through the first edge of the least significant bit of resolution in restoring is previously estimated and the estimated shift quantity or the correction quantity is also registered previously in a correction quantity select portion (not shown) of the correction quantity select unit 6.

When the absolute encoder passes through the first edge of the least significant bit of resolution in restoring, the rotational speed of the absolute encoder is detected by the speed detector 5 and the correction quantity is determined by the correction quantity select unit 6.

Similarly to the output position data, the correction quantity is also output externally of the absolute encoder 8 and is input to a CPU 31" disposed within a servo amplifier 30".

In the CPU 31", the correction quantity is added to an encoder feedback value, so that the shift quantity can be corrected.

Alternatively, a similar effect can also be obtained when the CPU 31" is used to subtract the correction quantity from command position data to perform the correction processing. Also, when the correction quantity is added or subtracted, if the correction quantity is divided into sub-sections and the sub-sections are gradually added or subtracted, then it is possible to moderate the sudden change of the position data caused by the position shift correction.

The entire disclosure of each and every foreign patent application from which the benefit of foreign priority has been claimed in the present application is incorporated herein by reference, as if fully set forth.

Although this invention has been described in at least one preferred embodiment with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. A method of generating the current position of an absolute encoder after it is energized, the current position being restored at an arbitrary resolution, for application to the rotations of the absolute encoder after restoration of the current position thereof, comprising:

setting a maximum rotational speed limit;

detecting the rotational speed of said absolute encoder;

generating a plurality of signals, including a given signal, for identifying a restored current position for restoration;

modifying said restored current position by at least one increment pulse, said pulse being added to or subtracted from said restored current position, and outputting the resultant value as a resultant current position, said resultant current position being generated at a predetermined edge of said given signal, setting said current position to be a predetermined value equivalent to said predetermined edge position under the following circumstances:

if the rotational speed of said absolute encoder when a given value is set at said predetermined edge of said given signal is equal to or more than said speed limit, prohibiting the setting of said predetermined value, and if the rotational speed of said absolute encoder when a given value is set at said predetermined edge of said given signal is less than said speed limit, setting of said predetermined value.

2. The method as set forth in claim 1 wherein said setting is conducted only after said rotational speed goes below said speed limit.

3. The method as set forth in claim 2 further comprising:

determining whether said rotation is in a forward or reverse direction; and on the basis of the determination of a forward or reverse direction, detecting a respective rising or falling edge of said given signal and respectively adding or subtracting said incremental pulse from said predetermined value.

4. The method as set forth in claim 1 wherein said given signal is the least significant bit of resolution.

5. A method of generating the current position of an absolute encoder after it is energized, the current position being restored at an arbitrary resolution, for application to the rotations of the absolute encoder after restoration of the current position thereof, comprising:

setting a maximum rotational speed limit;

detecting the rotational speed of said absolute encoder;

generating a plurality of signals, including a given signal, for identifying a restored current position for restoration;

when the rotational speed of said absolute encoder is less than a predetermined value, modifying said restored current position by at least one increment pulse, said pulse being added to or subtracted from said restored current position, and outputting the resultant value as a resultant current position, said resultant current position being generated at a predetermined edge of said given signal, and when the rotational speed of said absolute encoder is equal to or more than a predetermined value, generating a predetermined value at each predetermined edge of said given signal.

6. The method as set forth in claim 5 further comprising:

once said rotational speed goes below said speed limit, determining whether said rotation is in a forward or reverse direction; and on the basis of the determination of a forward or reverse direction, detecting a respective rising or falling edge of said given signal and respectively adding or subtracting said incremental pulse from output position data.

7. The method as set forth in claim 1 wherein said given signal is the least significant bit of resolution.

8. A method of generating the current position of an absolute encoder after it is energized, the current position being restored at an arbitrary resolution, for application to the rotations of the absolute encoder after restoration of the current position thereof, said absolute encoder being operative in connection with a motor driven by a servo amplifier, comprising:

setting a maximum rotational speed limit;

detecting the rotational speed of said absolute encoder by an output of the servo amplifier;

generating a plurality of signals, including a given signal, for identifying a restored current position for restoration;

modifying said restored current position by at least one increment pulse, said pulse being added to or subtracted from said restored current position, and outputting the resultant value as a resultant current position, said resultant current position being generated at a predetermined edge of said given signal;

setting said current position to be a predetermined value equivalent to said predetermined edge position under the following circumstances:

if the rotational speed of said absolute encoder on the basis of said servo amplifier output is equal to or more than said speed limit, generating a predetermined value at said predetermined edge of said given signal, and if the rotational speed of said absolute encoder on the basis of said servo amplifier output is less than said speed limit, executing the generation of said resultant current position when said absolute encoder first reaches said predetermined edge of said given signal.

9. The method as set forth in claim 8 wherein said given signal is the least significant bit of resolution and, after said first predetermined edge results in generation of said resultant current position, prohibiting resetting of the output position data at a subsequent predetermined edge of said given signal.

10. A method of generating the current position of an absolute encoder after it is energized, the current position being restored at an arbitrary resolution, for application to the rotations of the absolute encoder after restoration of the current position thereof, comprising:

setting a maximum rotational speed limit;

detecting the rotational speed of said absolute encoder;

generating a plurality of signals, including a given signal, for identifying a restored current position for restoration;

modifying said restored current position by at least one increment pulse, said pulse being added to or subtracted from said restored current position, and outputting the resultant value as a resultant current position, said resultant current position being generated at a predetermined edge of said given signal, setting said current position to be a predetermined value equivalent to said predetermined edge position, said predetermined value being set according to the rotational speed of said absolute encoder obtained when a given value is generated at said predetermined edge of said given signal.

11. The method as set forth in claim 10 wherein said execution is conducted only after said rotational speed goes below said speed limit.

12. The method as set forth in claim 10 further comprising:

determining whether said rotation is in a forward or reverse direction; and on the basis of the determination of a forward or reverse direction, detecting a respective rising or falling edge of said given signal and respectively adding or subtracting said incremental pulse from output position data.

13. The method as set forth in claim 10 further comprising storing a plurality of values corresponding to rotational speed and retrieving said values on the basis of said detected speed.

14. A method of generating the current position of an absolute encoder after it is energized, the current position being restored at an arbitrary resolution, for application to the rotations of the absolute encoder after restoration of the current position thereof, comprising:

setting a maximum rotational speed limit;

detecting the rotational speed of said absolute encoder;

generating a plurality of signals, including a given signal, for identifying a restored current position for restoration;

modifying said restored current position by at least one increment pulse, said pulse being added to or subtracted from said restored current position, and outputting the resultant value as a resultant current position, said resultant current position being generated at a predetermined edge of said given signal, outputting said values to be generated according to the rotational speed of said absolute encoder obtained when a predetermined value is generated at said predetermined edge of said given signal.

15. An absolute encoder for restoring the current position thereof at arbitrary resolution after energization thereof comprising:

means for generating a plurality of signals indicative of the current position of said encoder for use in restoring;

means for restoring said absolute encoder to a predetermined current position;

means for adding or subtracting one or more increment pulses to and from the restored current position for the rotations thereof after the restoration and for outputting a resultant value as the current position thereof, means for generating the current position of said encoder at the edge of a predetermined signal included in a plurality of signals used to generate the current position thereof in restoring, said absolute encoder further comprising a light emitting part and means for increasing the light quantity of said light emitting part temporarily until said absolute encoder passes through the edge of a given signal occurring first after said encoder is energized.

16. An absolute encoder as set forth in claim 15, further including means, when said rotational speed is equal to or greater than a given value, for increasing the light quantity of said light emitting part temporarily until said absolute encoder passes through the edge of a given signal occurring first after said encoder is energized.

17. An apparatus for generating the current position of an absolute encoder after it is energized, the current position being restored at an arbitrary resolution, for application to the rotations of the absolute encoder after restoration of the current position thereof, comprising:

means for setting a maximum rotational speed limit;

means for detecting the rotational speed of said absolute encoder;

means for generating a plurality of signals, including a given signal, for identifying a restored current position for restoration;

means for modifying said restored current position by at least one increment pulse, said pulse being added to or subtracted from said restored current position, and outputting the resultant value as a resultant current position, said resultant current position being generated at a predetermined edge of said given signal, means for setting said current position to be a predetermined value equivalent to said predetermined edge position under the following circumstances:

if the rotational speed of said absolute encoder when a given value is set at said predetermined edge of said given signal is equal to or more than said speed limit, prohibiting the setting of said predetermined value, and if the rotational speed of said absolute encoder when a given value is set at said predetermined edge of said given signal is less than said speed limit, setting of said predetermined value.

18. The apparatus as set forth in claim 17 wherein said setting is conducted only after said rotational speed goes below said speed limit.

19. The method as set forth in claim 18 further comprising:

means for determining whether said rotation is in a forward or reverse direction; and means for detecting a respective rising or falling edge of said given signal and respectively adding or subtracting said incremental pulse from said predetermined value on the basis of the determination of a forward or reverse direction.

20. An apparatus for generating the current position of an absolute encoder after it is energized, the current position being restored at an arbitrary resolution, for application to the rotations of the absolute encoder after restoration of the current position thereof, comprising:

means for setting a maximum rotational speed limit;

means for detecting the rotational speed of said absolute encoder;

means for generating a plurality of signals, including a given signal, for identifying a restored current position for restoration;

means, when the rotational speed of said absolute encoder is less than a predetermined value, for modifying said restored current position by at least one increment pulse, said pulse being added to or subtracted from said restored current position, and outputting the resultant value as a resultant current position, said resultant current position being generated at a predetermined edge of said given signal, and means, when the rotational speed of said absolute encoder is equal to or more than a predetermined value, for generating a predetermined value at each predetermined edge of said given signal.

\* \* \* \* \*